United States Patent [19]
Hasunuma et al.

[11] Patent Number: 6,069,071
[45] Date of Patent: May 30, 2000

[54] METHOD OF MANUFACTURING AN INTERCONNECT BY DISSOLVING AN INTERMETALLIC COMPOUND FILM INTO A MAIN COMPONENT OF A METAL FILM

[75] Inventors: Masahiko Hasunuma, Yokohama; Hisashi Kaneko, Fujisawa, both of Japan

[73] Assignee: Kabushiki Kaisha Toshiba, Kawasaki, Japan

[21] Appl. No.: 08/996,240

[22] Filed: Dec. 22, 1997

[30] Foreign Application Priority Data

Dec. 26, 1996 [JP] Japan .................................. 8-356495

[51] Int. Cl.⁷ .................................................. H01L 21/44
[52] U.S. Cl. .......................... 438/637; 438/643; 438/661; 438/687; 438/688
[58] Field of Search .................................... 438/618, 625, 438/642, 658, 652, 660, 668, 687, 927, 661, 643, 688, 637; 257/762, 765, 767, 771

[56] References Cited

U.S. PATENT DOCUMENTS

| | | | |
|---|---|---|---|
| 4,201,999 | 5/1980 | Howard et al. | 357/15 |
| 4,970,176 | 11/1990 | Tracy et al. | |
| 5,300,307 | 4/1994 | Frear et al. | 427/96 |
| 5,391,517 | 2/1995 | Gelatos et al. | 438/190 |
| 5,395,795 | 3/1995 | Hong et al. | 438/190 |
| 5,545,590 | 8/1996 | Licata | 438/189 |
| 5,629,236 | 5/1997 | Wada et al. | 438/607 |
| 5,633,199 | 5/1997 | Fiordalice et al. | 438/642 |
| 5,693,564 | 12/1997 | Yu | 438/643 |
| 5,804,879 | 9/1998 | Ogawa et al. | 257/765 |

FOREIGN PATENT DOCUMENTS 5-152248  6/1993  Japan .

*Primary Examiner*—Wael Fahmy
*Assistant Examiner*—Kurt Eaton
*Attorney, Agent, or Firm*—Finnegan, Henderson, Farabow, Garrett & Dunner, L.L.P.

[57] ABSTRACT

The intermetallic compound used to form a liner in the wiring of the semiconductor device is formed from a compound of a main component of the metal film used as the wiring and at least one metal material made to be dissolved in the main component to form a solid solution, or from a compound of at least two metal materials capable of forming a solid solution with the main component. The metal elements constituting the intermetallic compound are made to be dissolved in the metal film to form a solid solution during a heat treatment, and thus the barrier formed by the liner, which has been a problem studied to be solved, can be absent. Therefore, a semiconductor device excellent in resistance against electromigration and a highly reliable wiring process can be obtained.

19 Claims, 4 Drawing Sheets

| LINER | THICKNESS OF LINER | OPEN-SHORT | EM RESULT |
|---|---|---|---|
| $Al_{85}Cu_{15}$ | 20 | OPEN | — |
| $Al_{75}Cu_{25}$ | 20 | ○ | ○ |
| $Al_{34}Cu_{66}$ | 5 | OPEN | — |
| $Al_{34}Cu_{66}$ | 10 | ○ | ○ |
| $Al_{34}Cu_{66}$ | 20 | ○ | ○ |
| $Al_{20}Cu_{80}$ | 20 | ○ | ○ |
| $Al_{10}Cu_{90}$ | 20 | OPEN | — |
| Cu | 20 | OPEN | — |
| NO USE | — | OPEN | — |
| Ti | 20 | ○ | × |
| W | 20 | ○ | × |

FIG. 2

METHOD OF MANUFACTURING AN INTERCONNECT BY DISSOLVING AN INTERMETALLIC COMPOUND FILM INTO A MAIN COMPONENT OF A METAL FILM

BACKGROUND OF THE INVENTION

The present invention relates to a method of manufacturing a semiconductor device, and more particularly to a method of forming a multilayer wiring for a semiconductor device.

In forming multilayer wiring in a semiconductor device integrated circuit, such a material as W, Al, or Cu is deposited in selective CVD, blanket CVD, or other similar processes, or the metallization of a material such as Cu or Al is performed in the metal reflow process by the heat treatment during or after the deposition process.

In the former case, tungsten itself or barrier metal may prevent the mobility of the wiring metal atoms when the electromigration occurs. While, in the latter process, material of a liner used for improving the reflow characteristics of the wiring metal or an intermetallic compound produced from the reaction of the liner material and the wiring metal may reduce the mobility of the wiring metal atoms. As a result, voids may be formed on the cathode side of the barrier by the depletion of the wiring metal atoms, thereby the effective resistivity in the wiring may increase or the discontinuity in the wiring may be caused. While, on the anode side of the barrier, excess wiring metal atoms are accumulated to cause hillocks, thereby a short circuit may occur at the boundary between the wire and the adjacent wire. As described above, the conventional materials used for the multilayer wiring have caused the reduction of the electromigration resistance of the multilayer wiring itself.

In order to solve this problem, a section such as fringe or reservoir for reserving the wiring metal atoms is provided to the neighborhood of the plug section, as a source of wiring metal atoms. Such a wiring metal atom source, however, can reserve only a little amount of wiring metal atoms, and thus is not so efficient for prolonging the lifetime of the wiring. In addition, the wiring has been decreased in size and increased in density more and more, and thus the space for forming such a reservoir will be necessarily reduced or lost in future. In consideration thereof, the fundamental solution needs to be given to the multilayer wiring.

In addition to the above-mentioned problem, a Ti liner, that is mainly investigated now as the liner material used in the Al reflow process, reacts with the lower level Al wiring to produce a compound ($Al_3Ti$) at the bottom of a via hole, resulting in the forming of a barrier between the via hole and the lower level wiring. Further, when such a compound is produced, the ratio of the liner layer in the wiring substantially increases, and thus the effective resistivity of the wiring will also increase.

The high-temperature deposition technique such as a reflow process, wherein such a liner layer which forms the barrier as mentioned above is not formed, can be employed to fill the via hole. With the high-temperature deposition technique, however, the deposited or reflow metal layer will fracture and agglomerate due to the heat applied thereto during the process. The agglomerated metal particles may prevent the atoms from being deposited in the via hole or block the reflow path. As a result, the via hole will be prevented from being completely filled.

In recent years, the CVD technique has been also studied as another technique of filling the via hole. However, in some cases, the material of the wiring is added with the additive element (such as Cu in the Al wiring) for enhancing the reliability of the wiring. If the dissociation temperature of the additive element contained in the CVD gas differs from that of the wiring material, the resultant alloy film formed by the CVD technique cannot have good property.

BRIEF SUMMARY OF THE INVENTION

Accordingly, it is an object of the present invention to provide a method of manufacturing a highly reliable semiconductor with desirable wiring properties such as electromigration resistance.

It is another object of the present invention to provide a method of manufacturing a highly reliable semiconductor device, without the barrier which may reduce the electromigration resistance of the device.

According to one aspect of the present invention, there is provided a method of manufacturing the semiconductor device, comprising the steps of: forming a conductive layer on the main surface of a semiconductor substrate; forming an insulating film having a via hole section which reaches the conductive layer; forming an intermetallic compound film, which functions as a liner for helping a reflow process on the insulating film having the via hole section; forming a metal film on at least a part of the intermetallic compound film which is located in each of the hole section; and making metals constituting the intermetallic compound film be dissolved in a main component the metal film at least in part to form a solid solution by performing a heat treatment during or after the metal film forming step.

According to another aspect of the present invention, there is provided a method of manufacturing the semiconductor device, comprising the steps of: forming a conductive layer on the main surface of a semiconductor substrate; forming an insulating film which has a via hole section reaching the conductive layer and has a groove section connected to the hole section and used for forming wiring therein; forming an intermetallic compound film, which functions as a liner for helping a reflow process, on the insulating film having the via hole section and the groove section; forming a metal film as the wiring on at least a part of the intermetallic compound film which is located in the hole section and the groove section; making metals constituting the intermetallic compound film be dissolved in a main component the metal film at least in part to form a solid solution by performing a heat treatment during or after the metal film forming step; and removing a predetermined thickness of the metal film into which at least the part of the intermetallic compound film is made to be dissolved to form the wiring in the groove section.

In the above-mentioned methods, the intermetallic compound film is preferably formed from a compound of the main component of the metal film and at least one metal element capable of forming a solid solution with the main component of the metal film, or from a compound of at least two metal elements capable of forming a solid solution with the main component of the metal film.

The material such as aluminum or copper can be used to form the metal film as the main component. When the aluminum is used to form the metal film, the intermetallic compound film can be formed of a compound of aluminum and copper, for example.

The intermetallic compound film functions as a liner for helping the reflow process of the metal film constituting the wiring. During the heat treatment in the reflow process, a part or all of the intermetallic compound film is made to be dissolved in the metal film to form a solid solution. With such an intermetallic compound film, a part or all of the barrier which is formed at the bottom of the via hole and has conventionally reduced the electromigration resistance of a semiconductor device is absent, and the electromigration resistance of the device can be improved. Further, by making a part or all of the intermetallic compound film formed of the metal material which can improve the electromigration resistance be dissolved in the metal film to form a solid solution, the electromigration resistance of the device can be improved.

The amount of the metal constituting the intermetallic compound film, which is made to be dissolved in the metal film to form a solid solution, can be varied by adjusting the thickness of the metal film constituting the wiring, and thus the effective resistivity of the wiring can be controlled. Even if the metal film is formed to be thick, the wiring having a desired thickness can be obtained by removing the excess thickness of the metal film in the subsequent process such as a CMP process. Further, even if the CVD technique is used to fill the via holes, the metal material for improving the electromigration resistance can be supplied to the via hole section.

By using the intermetallic compound film as a liner in the reflow process in this manner, agglomeration of metal can be prevented for the first time by the present invention in the reflow process in which a metal film formed from a single layer metal is agglomerated due to the heat applied in the reflow process. The intermetallic compound film of the present invention can function as a stable liner against the heat applied thereto during the wiring metal reflow process or the CVD process. This is because, the wetability of the main component of the metal film on the intermetallic compound film is better than that of $SiO_2$.

It is preferable to use the compound of Cu and Al as a liner in Al wiring, because Cu element improves both the electromigration resistance and stress migration resistance in Al wiring. More specifically, it is preferable for a liner to comprise a γ1 ($Al_4Cu_9$) layer having high stability against a high temperature, as a main liner layer. In this time, the liner comprises a plurality of layers such as a Cu layer and a δ layer, which will cause no problem. The intermetallic compound for forming the liner must be able to be made to be dissolved in the metal as the main component of the wiring to form a solid solution during the heat treatment, as a requisite.

The Al wiring may be formed of the other alloy than Cu—Al, such as Al—Sc ($Al_3Sc$, $Al_2Sc$, AlSc, $AlSc_2$, or the compound thereof), or Al—Ag (δ layer). The Al wiring is preferably formed to contain a refractory intermetallic compound which has relatively higher melting point and is formed of the compound of two materials selected from a group of elements comparatively large amount of which can form a solid solution with Al, i.e., Cu, Sc, Zn, Mg, Ge, Ga, and Li. Specifically, Mg—Zn ($MgZn_2$), Cu—Zn (γ layer), Cu—Ga (γ layer), Cu—Ge (ζ layer), Cu—Si ($Cu_3Si$), Mg—Si ($Mg_2Si$), Ag—Mg (AgMg), or Ag—Zn (AgZn), which can prevent the increase of the Al wiring in the effective resistivity after the forming of a solid solution, are more preferable as an intermetallic compound to be dissolved in the Al wiring. The intermetallic compound is not limited to the binary compound, but may be a polyphyletic compound constituted by several elements such as Zn, Mg, Ge, Ga, and Li.

While, in a Cu wiring, it is preferable to use the compound such as Cu—Be(δ layer), Cu—Si ($Cu_3Si$), Cu—Zn (β layer and γ layer), Cu—Ti ($TiCu_4$, $Ti_2Cu_3$, $Ti_3Cu_4$, TiCu, $Ti_2Cu$), Cu—Mg ($MgCu_2$), Cu—Ge (ζ layer), Cu—As (γ layer), Au—Zn (AuZn), Au—Be (AuBe, $AuBe_3$, $AuBe_5$), Au—Mg (MgAu), Ag—Be ($AgBe_2$), Ag—Mg (AgMg), or Be—Mg ($Be_{13}Mg$), as an intermetallic compound.

It causes no problem when the liner is formed in a via hole to form the barrier metal on the lowest layer of the wiring. It is important, however, to form the liner in such a process wherein no barrier metal remains at the bottom of the via hole, i.e., the junction between the via hole and the lower metal wiring, after the forming of the liner.

When a heat treatment is performed after deposition of the wiring layer in order to make the liner layer be dissolved in the wiring so as to form a solid solution, the temperature of the heat treatment needs to be determined in consideration of the stress migration resistance of the lower level electrode wiring. In the Al wiring, the temperature is preferably set the temperature range from 350 to 500° C. In the Cu wiring, the temperature is preferably set the temperature range from 350 to 600° C. in order to prevent the diffusion of Cu atoms toward the active device section.

It is ideal to set the opening area rate of the liner layer at the bottom of the via hole (i.e., the area rate at which the upper metal wiring and the lower metal wiring are brought into contact) at 100% when the liner layer is made to be dissolved in the metal film to form a solid solution in the heat treatment, but it is acceptable if the opening area rate is set at 30% or more.

The thickness of the liner layer is set at 10 nm or more in order to form the liner layer as a continuous film without any break. The liner layer is preferably formed in the sputtering, CVD, or the other physical deposition process. The anisotropic deposition process may be employed in the deposition process.

The sputtering, CVD, or the other physical deposition process are also preferable to form the wiring layer on the liner layer. In the sputtering process, it is preferable for completely filling the via holes to perform the deposition of a film of 50 nm thick by the non-heating deposition technique, and without any interval from the non-heating deposition, perform the heating deposition by heating the substrate at 300° C. or more without exposing the substrate to the atmosphere. While, the CVD deposition process, either of the selective CVD and the blanket CVD may be employed, or either of them may be combined with the sputtering technique. When the selective CVD is employed, the wiring layer may be formed after the via holes are filled by the CVD technique and the metal on the via hole is planarized by the CMP technique or the etching-back technique. It has been difficult with the conventional CVD technique to add the additive element to the main component of the wiring. According to the present invention, the additive element is dissolved in the liner, and thus can be diffused in the wiring to form a solid solution during the subsequent heat treatment.

The present invention is applicable not only to the multilayer wiring having the single or dual damascene structure, but also to the wiring formed in a deposition or RIE process after forming the via hole in the single damascene structure.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a table for explaining the properties such as electromigration resistance of semiconductor devices using various liners.

DETAILED DESCRIPTION OF THE INVENTION

The embodiments of the present invention will be described below with reference to the accompanying drawings.

Figure 1A:
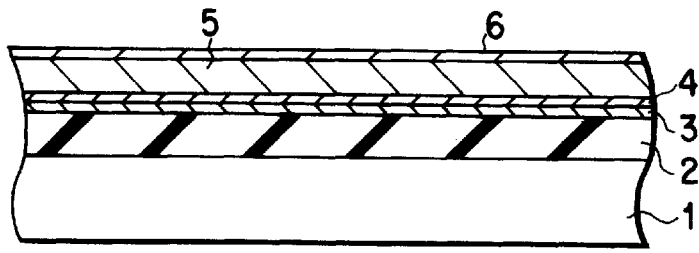
FIGS. 1A to 1J are sectional views of a semiconductor device, for showing the steps of a manufacturing method according to the first embodiment of the present invention.

FIGS. 1A to 1J are sectional views of a semiconductor device, for showing the steps of a manufacturing method according to the first embodiment of the present invention, in order. In this embodiment, a TEG (Test Element Group) for the reliability test of the wiring is formed by way of trial in the following manner:

Firstly, a thermal oxidation film 2 having a thickness of 400 nm is formed on a semiconductor substrate 1 (a (100) oriented Si substrate) as shown in FIG. 1A. Subsequently, a Ti film 3 of 20 nm thick and a TiN film 4 of 70 nm thick are respectively formed by the sputtering technique, and then an Al film 5 of 400 nm thick is formed also by the sputtering technique. Next, a TiN film 6 as a reflection preventing film is deposited thereon to have a thickness of 30 nm.

Figure 1B:
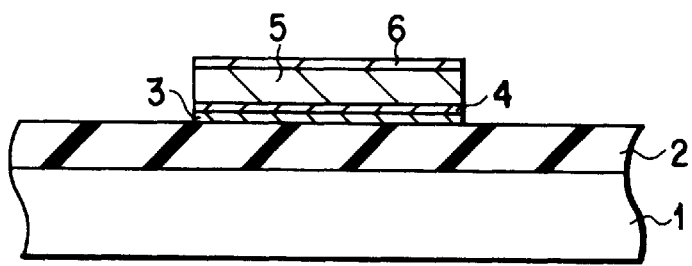
Figure 1C:
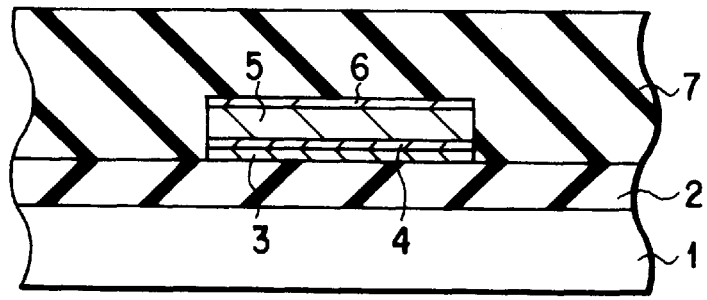
Figure 1D:
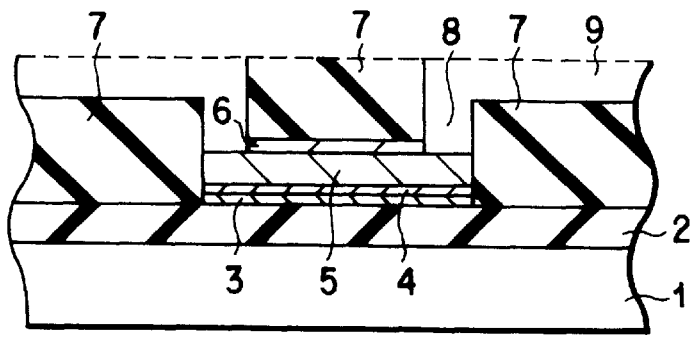

Thereafter, the Ti film 3, TiN film 4, Al film 5, and TiN film 6 are patterned to form lower level wires each having a width of 400 nm and a length of 50 μm as shown in FIG. 1B and being arranged at intervals of 50 μm. Next, as shown in FIG. 1C, a plasma TEOS film 7 as an interlayer insulating film is deposited on the device to have a thickness of 1.5 μm from the thermal oxidation film 2, and then planarized by the CMP (Chemical Mechanical Polishing) technique to have a thickness of 800 nm from the lower level wires.

The plasma TEOS film 7 is then patterned to form wiring grooves 9 each having a width of 400 nm, a depth of 400 nm, and a length of 50 μm and via holes 8 each having a diameter of 400 nmφ such that the lower level wires are connected to upper level wires to be formed in the grooves 9 thereby. Portions of the reflection preventing film 6 are removed by the RIE (Reactive Ion Etching) technique when the via holes are formed.

Figure 1E:
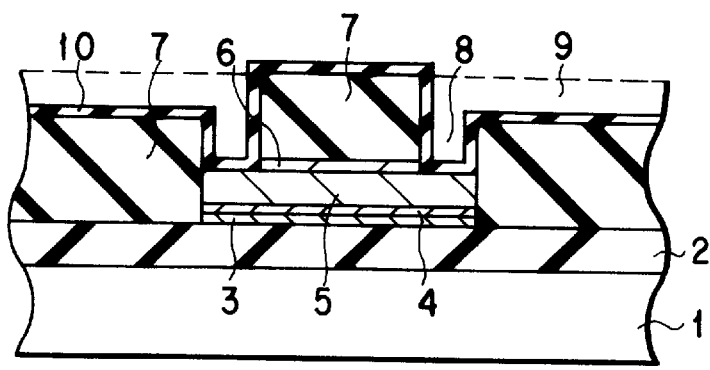

Subsequently, one of the types of liners 10 suggested in the table of FIG. 2 is formed in the sputtering process to cover an entire surface of the device, as shown in FIG. 1E. Prior to the forming of the liner 10, natural oxide films formed on the surface of the exposed Al film 5 at the bottoms of the via holes 8 are removed by the bias cleaning technique.

Figure 1F:
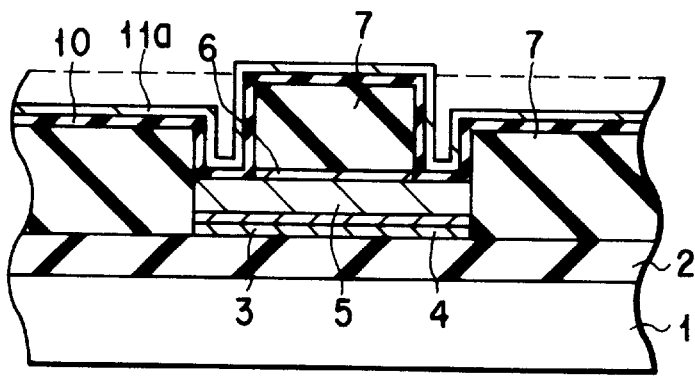
Figure 1G:
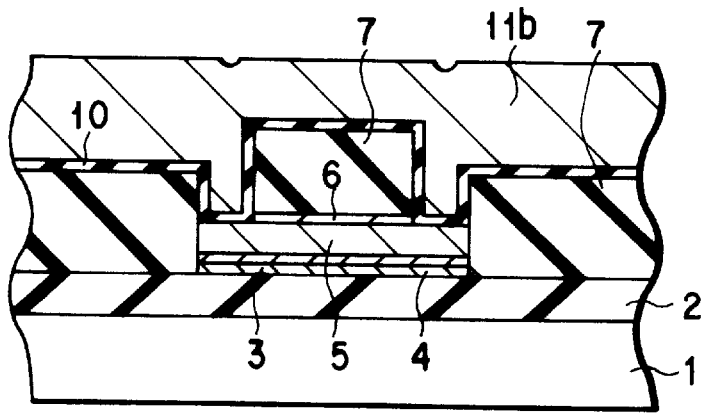

In the next step shown in FIG. 1F, an Al film 11a is formed from pure Al when the liner 10 is formed of the compound of Cu—Al, and in the other cases, the Al film 11a is formed of Al—Cu (containing 0.5 wt % of Cu). Immediately after the Al film 11a is formed, an Al film 11b is formed at 450° C., as shown in FIG. 1G, without exposing the film to the atmosphere. The composition of the Al film 11b is the same as that of the Al film 11a.

Figure 1H:
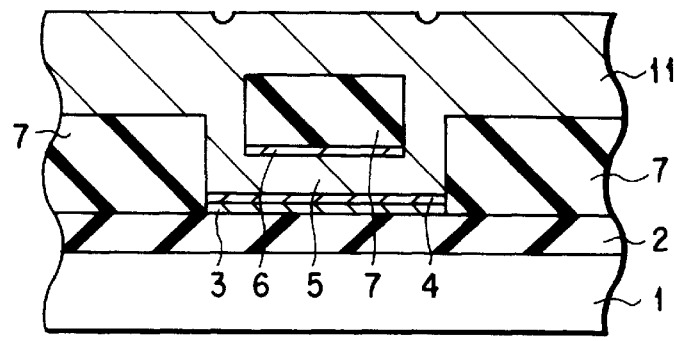

After forming the Al films by the reflow technique in this manner, the heat treatment is performed at 450° C. for 30 minutes to make all of the liner 10 formed of Cu—Al alloy be dissolved in the Al film 11 to form a solid solution, as shown in FIG. 1H. It was observed from the sectional view of the device that the opening area rate of each of the via holes 8 at the bottom was 100%. Similarly, with use of a SIMS (Secondary Ion Mass Spectroscopy), no segregation of oxygen and Cu was observed at the interface between the Al film 5 and the bottom surface of each via hole. While, in a sample device which was formed of a Ti liner for comparing with the above-mentioned device, it was observed that Al$_3$Ti was formed in each via hole at the bottom surface.

Figure 1I:
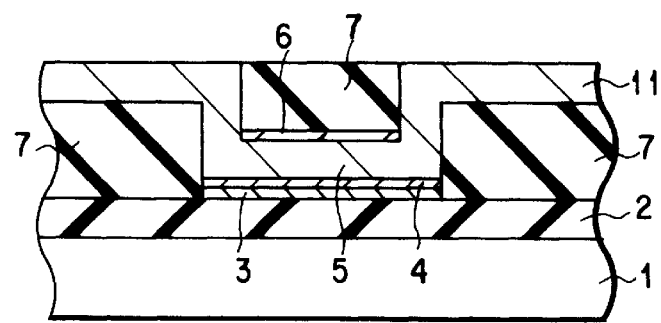
Figure 1J:
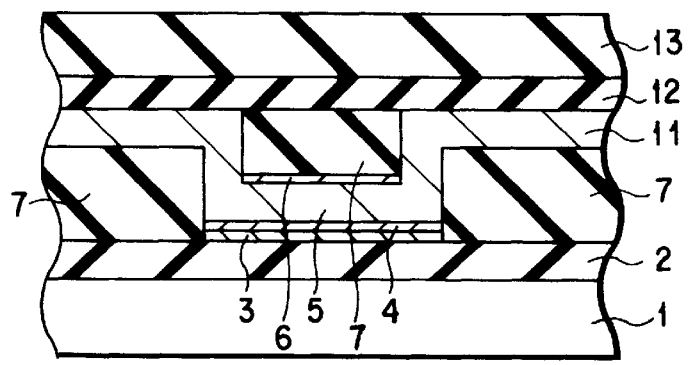

Next, the excess thickness of the Al film 11 is removed by the CMP technique as shown in FIG. 1I such that the Al film is completely buried in the wiring grooves 9 to form the wiring. Thereafter, a plasma TEOS film 12 having a thickness of 350 nm and a plasma SiN film 13 having a thickness of 750 nm are formed as protection films, as shown in FIG. 1J.

The TEG for measuring the EM (electromigration) resistance is formed in the above-mentioned manner. The total length of the line is 2 mm, and an accelerated test by applying electric currents was performed after the pad is opened. The test was performed at 200° C. under the condition where the current density of the current flowing the wiring is 1.8 MA/cm$^2$. The test result is suggested in the table of FIG. 2. The samples shown in the table respectively have a liner 10 having a predetermined thickness, and 50 samples were tested in each case. The samples having the MTTF (Mean Time To Failure) below 100 hours are presented by "X", those having the MTTF of 100 to 1000 hours are presented by "Δ", and those having the MTTF above 1000 hours are presented by "○".

As is clear from the result indicated by FIG. 2, the liner film 10 can have good properties when the ratio of Al to Cu is set within a suitable range and the liner has a predetermined level of the thickness.

Accordingly, it is preferable to use as a liner in Al wiring in which Al is used as the main component the compound of Cu and Al which improves both the electromigration resistance and stress migration resistance. More specifically, it is preferable for a liner to comprise a γ1 (Al$_4$Cu$_9$) layer having high stability against a high temperature, as a main liner layer. In this time, the liner comprises a plurality of layers such as a Cu layer and a δ layer, which will cause no problem. The intermetallic compound for forming the liner must be able to be made to be dissolved in the metal as the main component of the wiring to form a solid solution during the heat treatment, as a requisite.

Also in the case where the liner 10 was formed from the other compound than the Cu—Al, e.g. Al—Sc (Al$_3$Sc, Al$_2$Sc, AlSc, AlSc$_2$, or the compound thereof), Al—Ag (δ layer), Mg—Zn (MgZn$_2$), Cu—Zn (γ layer), Cu—Ga (γlayer), Cu—Ge (ζ layer), Cu—Si (Cu$_3$Si), Mg—Si (Mg$_2$Si), Ag—Mg (AgMg), or Ag—Zn (AgZn), good results were obtained in an open-short circuit test (wire failure test) and the accelerated test by applying electric currents after the forming of the multilayer wiring.

The same tests were also performed for the wiring formed from Cu by forming the TEG thereof in the same manner shown in FIGS. 1A to 1J. The devices using the liners 10 respectively formed from various compounds such as Cu—Be(δ layer), Cu—Si (Cu$_3$Si), Cu—Zn (β layer and γ layer), Cu—Ti (TiCu$_4$, Ti$_2$Cu$_3$, Ti$_3$Cu$_4$, TiCu, Ti$_2$Cu), Cu—Mg (MgCu$_2$), Cu—Ge (ζ layer), Cu—As (γlayer), Au—Zn (AuZn), Au—Be (AuBe, AuBe$_3$, AuBe$_5$), Au—Mg (MgAu), Ag—Be (AgBe$_2$), Ag—Mg (AgMg), and Be—Mg (Be$_{13}$Mg), were subjected to the test, and good results were obtained both in the open-short circuit test ((wire failure test) and the accelerated test by applying electric currents after the forming of the multilayer wiring.

It causes no problem when the liner is formed in a via hole to form the barrier metal on the lowest layer of the wiring. It is important, however, to form the liner in such a process wherein no barrier metal remains at the bottom of the via hole, i.e., the junction between the via hole and the lower metal wiring, after the forming of the liner.

When a heat treatment is performed after deposition of the wiring layer in order to make the liner layer be dissolved in the wiring so as to form a solid solution, the temperature of the heat treatment needs to be determined in consideration of the stress migration resistance of the lower level electrode wiring. In the Al wiring, the temperature is preferably set the temperature range from 350 to 500° C. In the Cu wiring, the temperature is preferably set the temperature range from 350 to 600° C. in order to prevent the diffusion of Cu atoms toward the active device section.

It is ideal to set the opening area rate of the liner layer at the bottom of the via hole (i.e., the area rate at which the upper metal wiring and the lower metal wiring are brought into contact) at 100% when the liner layer is made to be dissolved in the metal film to form a solid solution in the heat treatment, but it is acceptable if the opening area rate is set at 30% or more.

The thickness of the liner layer is set at 10 nm or more in order to form the liner layer as a continuous film without any break. The liner layer is preferably formed in the sputtering, CVD, or the other physical deposition process. The anisotropic deposition process may be employed in the deposition process.

The sputtering, CVD, or the other physical deposition process are also preferable to form the wiring layer on the liner layer. In the sputtering process, it is preferable for completely filling the via holes to perform the deposition of a film of 50 nm thick by the non-heating deposition technique, and without any interval from the non-heating deposition, perform the heating deposition by heating the substrate at 300° C. or more without exposing the substrate to the atmosphere. While, the CVD deposition process, either of the selective CVD and the blanket CVD may be employed, or either of them may be combined with the sputtering technique. When the selective CVD is employed, the wiring layer may be formed after the via holes are filled by the CVD technique and the metal on the via hole is planarized by the CMP technique or the etching-back technique. It has been difficult with the conventional CVD technique to add the additive element to the main component of the wiring. According to the present invention, the additive element is dissolved in the liner, and thus can be diffused in the wiring to form a solid solution during the subsequent heat treatment.

The present invention is applicable not only to the multilayer wiring having the single or dual damascene structure, but also to the wiring formed in a conventional planar deposition or RIE process after forming the via hole in the single damascene structure.

In the example shown in FIGS. 1A to 1J, the liner is made to be dissolved in the Al film to form a solid solution by performing the heat treatment after the Al film is formed in the reflow process. Also by using the heat applied to the device during the Al reflow process, a part or all of the liner material can be made to be dissolved in the Al film to form a solid solution. When all of the liner material can be made to be dissolved in the Al film to form a solid solution during this Al reflow process, the heat treatment after the reflow process needs not to be necessarily performed.

The amount of Cu constituting the liner, which is made to be dissolved in the Al film to form a solid solution, can be changed by adjusting the thickness of the Al film, and thus the parameters such as the effective resistivity can be also controlled thereby. In this case, even if the Al film is formed too thick, the wiring can be formed to have a desired thickness by removing the excess thickness of the Al film by the CHP.

Figure 3:
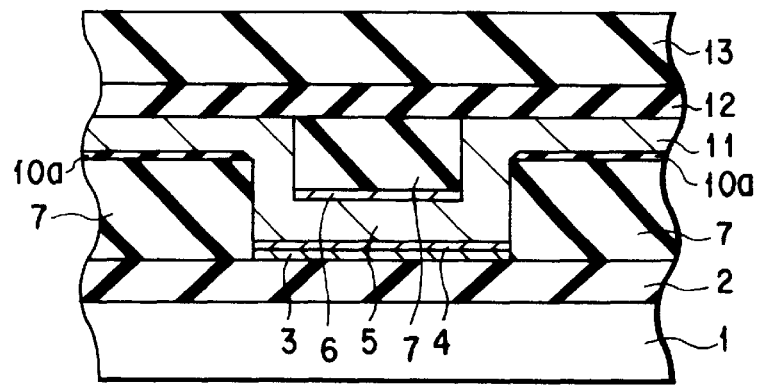
FIG. 3 is a sectional view of a semiconductor device as a modification of the first embodiment shown in FIGS. 1A to 1J.

A part of the liner 10a may be left in a wiring region formed on the plasma TEOS film 7 as shown in FIG. 3. In general, a liner is formed thick in the regions in which the wiring grooves are formed, in comparing with the bottom and side faces of a small opening. Accordingly, as shown in FIG. 3, the liner 10a can be left only in the region on the plasma TEOS film 7, in which the wiring grooves are formed. With such a structure, the liner 10a left on the plasma TEOS film 7 functions as the supplying source of Cu to Al layer, and thus the depletion of Cu can be prevented. Consequently, the electromigration of the device which may be caused due to the depletion of Cu can be prevented.

As described above, according to the present invention, the intermetallic compound used to form a liner is formed from a compound of the main component of the metal film used as the wiring and at least one metal material capable of forming a solid solution with the main component, or from a compound of at least two metal materials capable of forming a solid solution with the main wiring component. The metal elements constituting the intermetallic compound are made to be dissolved in the metal film to form a solid solution during a heat treatment, and thus the barrier formed by the liner, which has been a problem studied to be solved, can be absent. Therefore, according to the present invention, a semiconductor device excellent endurance against electromigration and highly reliable wiring process can be obtained.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A method of manufacturing a semiconductor device, comprising the step of:

forming a conductive layer on a main surface of a semiconductor substrate;

forming an insulating film having a via hole section which reaches the conductive layer;

forming an intermetallic compound film, which functions as a liner for helping a reflow process, on the insulating film having the via hole section;

forming a metal film on at least a part of the intermetallic compound film which is located in the via hole section; and making metals constituting the intermetallic compound film be dissolved in a main component of the metal film to form a solid solution, by one of a heat treatment performed in the metal film forming step and a heat treatment performed after the metal film forming step, so as to remove at least part of a barrier formed by the intermetallic compound film such that the metal film electrically and directly contacts the conductive layer.

2. A method according to claim 1, wherein the intermetallic compound film is formed from a compound of the main component of the metal film and at least one metal material capable of forming a solid solution with the main component or from a compound of at least two metal materials capable of forming a solid solution with the main component.

3. A method according to claim 1, wherein the conductive layer constitutes lower level wiring.

4. A method according to claim 1, wherein the main component of the metal film is aluminum.

5. A method according to claim 1, wherein the heat treatment during the dissolving step is performed within a temperature range from 350 to 500° C.

6. A method according to claim 1, wherein the main component of the metal film is copper.

7. A method according to claim 6, wherein the heat treatment during the dissolving step is performed within a temperature range from 350 to 600° C.

8. A method according to claim 1, wherein the main component of the metal film is aluminum, and the intermetallic compound film contains a compound of aluminum and copper.

9. A method according to claim 8, wherein the intermetallic compound film includes layers mainly constituted of a γ1 ($Al_4Cu_9$) layer.

10. A method according to claim 1, wherein the main component of the metal film is aluminum, and the intermetallic compound film contains one of compounds Al—Sc and Al—Ag.

11. A method according to claim 1, wherein the main component of the metal film is aluminum, and the intermetallic compound film contains a compound constituted by at least two of Cu, Sc, Zn, Mg, Ge, Ga, and Li.

12. A method according to claim 1, wherein the main component of the metal film is aluminum, and the intermetallic compound film contains one of compounds Mg—Zn, Cu—Zn, Cu—Ga, Cu—Ge, Cu—Si, Mg—Si, Ag—Mg, and Ag—Zn.

13. A method according to claim 1, wherein the main component of the metal film is copper, and the intermetallic compound film contains one of compounds Cu—Be, Cu—Si, Cu—Zn, Cu—Ti, Cu—Mg, Cu—Ge, Cu—As, Au—Zn, Au—Be, Au—Mg, Ag—Be, Ag—Mg, and Be—Mg.

14. A method according to claim 1, wherein the intermetallic compound film has a thickness of at least 10 nm.

15. A method according to claim 1, further comprising the step of adjusting a thickness of the metal film in order to determine an amount of metal constituting the intermetallic compound film, which is made to be dissolved in the metal film to form a solid solution.

16. A method of manufacturing a semiconductor device, comprising the steps of:

forming a conductive layer on a main surface of a semiconductor substrate;

forming an insulating film which has a via hole section reaching the conductive layer and has a groove section connected to the via hole section and used for forming wiring therein;

forming an intermetallic compound film, which functions as a liner for helping a reflow process, on the insulating film having the via hole section and the groove section;

forming a metal film as the wiring on at least a part of the intermetallic compound film which is located in the via hole section and the groove section;

making metals constituting the intermetallic compound film be dissolved in a main component of the metal film to form a solid solution, by one of a heat treatment performed in the metal film forming step and a heat treatment performed after the metal film forming step, so as to remove at least part of a barrier formed by the intermetallic compound film such that the metal film electrically and directly contacts the conductive layer; and removing a predetermined thickness of the metal film in which at least the part of the intermetallic compound film is made to be dissolved to form the wiring in the groove section.

17. A method according to claim 16, wherein the intermetallic compound film is formed from a compound of the main component of the metal film and at least one metal material capable of forming a solid solution with the main component or from a compound of at least two metal materials capable of forming a solid solution with the main component.

18. A method according to claim 16, further comprising the step of adjusting a thickness of the metal film in order to determine an amount of the metal materials constituting the intermetallic compound film, which is made to be dissolved in the metal film to form a solid solution.

19. A method according to claim 16, wherein only a part of the intermetallic compound film, which is formed on the groove section after the wiring forming step, is left in the semiconductor device.

* * * * *

UNITED STATES PATENT AND TRADEMARK OFFICE
CERTIFICATE OF CORRECTION

PATENT NO. : 6,069,071
DATED : May 30, 2000
INVENTOR(S) : Masahiko HASUNUMA et al.

It is certified that error appears in the above-identified patent and that said Letters Patent is hereby corrected as shown below:

Claim 1, Column 8, line 51, "step" should read --steps--.

Signed and Sealed this

Twenty-second Day of May, 2001

*Attest:*

NICHOLAS P. GODICI

*Attesting Officer*     *Acting Director of the United States Patent and Trademark Office*